United States Patent
Minamihaba et al.

(10) Patent No.: US 6,995,090 B2
(45) Date of Patent: Feb. 7, 2006

(54) POLISHING SLURRY FOR USE IN CMP OF SIC SERIES COMPOUND, POLISHING METHOD, AND METHOD OF MANUFACTURING SEMICONDUCTOR DEVICE

(75) Inventors: Gaku Minamihaba, Kawasaki (JP); Hiroyuki Yano, Yokohama (JP); Nobuyuki Kurashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 178 days.

(21) Appl. No.: 10/326,407

(22) Filed: Dec. 23, 2002

(65) Prior Publication Data

US 2003/0124850 A1 Jul. 3, 2003

(30) Foreign Application Priority Data

Dec. 27, 2001 (JP) .................................... 2001-398479

(51) Int. Cl.
*H01L 21/461* (2006.01)

(52) U.S. Cl. ........................ 438/692; 438/631; 438/633; 438/693

(58) Field of Classification Search .................. 438/626, 438/631, 633, 634, 645, 692, 693
See application file for complete search history.

(56) References Cited

U.S. PATENT DOCUMENTS

| 6,090,699 A | * | 7/2000 | Aoyama et al. | 438/622 |
| 6,444,139 B1 | * | 9/2002 | Minamihaba et al. | 216/89 |
| 6,611,060 B1 | * | 8/2003 | Toyoda et al. | 257/758 |
| 2002/0023389 A1 | * | 2/2002 | Minamihaba et al. | 51/308 |
| 2004/0018697 A1 | * | 1/2004 | Chung | 438/437 |

FOREIGN PATENT DOCUMENTS

JP   2001-196336   7/2001

OTHER PUBLICATIONS

Minamihaba, G. et al., "Slurry for Chemical Mechanical Polishing and Method of Manufacturing Semiconductor Device," U.S. Appl. No. 09/932,943, filed Aug. 21, 2001.
Notification of Reasons for Rejection (Office Action) for Japanese Patent Application NO. 2001–398479, dated Apr. 26, 2005.

* cited by examiner

*Primary Examiner*—Kevin M. Picardat
(74) *Attorney, Agent, or Firm*—Finnegan, Henderson, Farabow, Garrett & Dunner, L.L.P.

(57) ABSTRACT

A polishing slurry for CMP of an SiC series compound film, includes colloidal silica having a primary particle diameter ranging from 5 nm to 30 nm, and at least one acid selected from the group consisting of an amino acid having a benzene ring and an organic acid having a heterocycle.

17 Claims, 3 Drawing Sheets

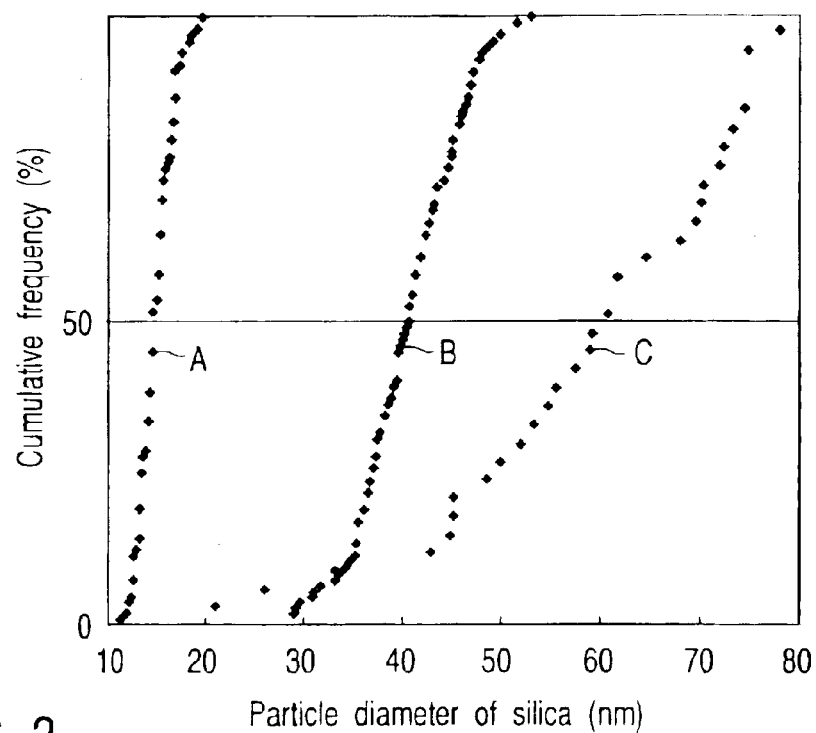
F I G. 3
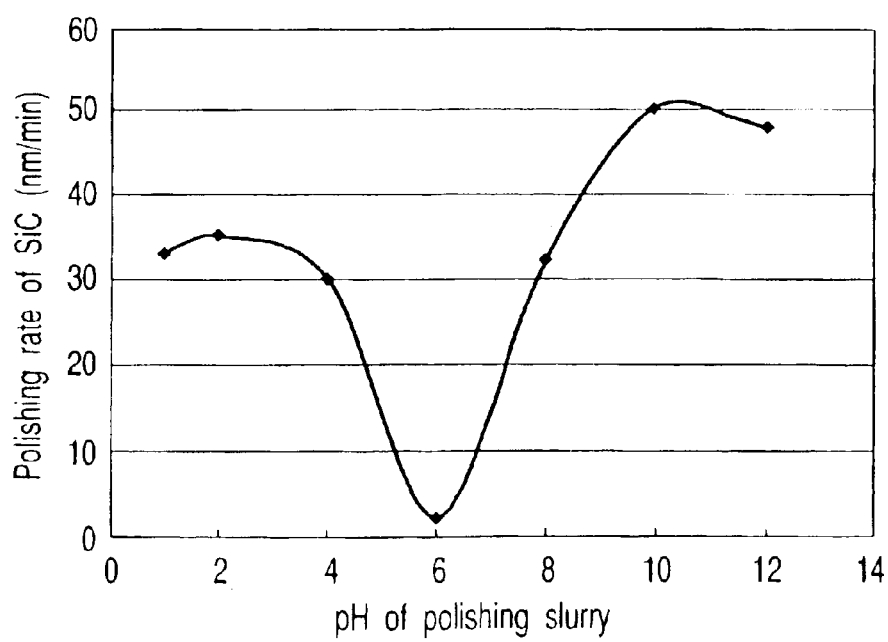
F I G. 4

US 6,995,090 B2

POLISHING SLURRY FOR USE IN CMP OF SiC SERIES COMPOUND, POLISHING METHOD, AND METHOD OF MANUFACTURING SEMICONDUCTOR DEVICE

CROSS REFERENCE TO RELATED APPLICATIONS

This application is based upon and claims the benefit of priority from the prior Japanese Patent Application No. 2001-398479, filed on Dec. 27, 2001; the entire contents of which are incorporated herein by reference.

BACKGROUND OF THE INVENTION

1. Field of the Invention

The present invention relates to a method of manufacturing a semiconductor device. In particular, the present invention relates to a polishing slurry which can be employed in the formation of a damascene wiring which is made of Cu or W and designed to be employed in a DRAM or a high-speed logic LSI, to the polishing method using the polishing slurry, and to the method of manufacturing a semiconductor device by making use of the polishing slurry.

2. Description of the Related Art

Up to the present, $SiO_2$ and SiN have been employed as an insulating material for LSI. In particular, $SiO_2$ film has been employed as a main insulating film. Whereas, SiN film has been employed as a mask or a stopper on the occasion of removing, for example, $SiO_2$ film by means of RIE (Reactive Ion Etching), or as a barrier film for preventing the diffusion of water and metals.

However, there is a problem that the relative dielectric constant of SiN is as high as 7. In the case of an LSI of the next generation, it is required that, in order to prevent the generation of time lag relative to the operating speed of semiconductor devices, the transmission speed (RC delay) of wirings should be improved. The employment of SiN which has a relatively high dielectric constant is not preferable because of the problem that the capacitance of wirings is caused to increase. Furthermore, there is another problem that the adhesive force of SiN to metals is insufficient.

Under the circumstances, in recent years, the employment of SiC has been studied as a substitute for SiN. The relative dielectric constant of SiC is as low as 5, and the adhesivity thereof to metals is also excellent. Therefore, as far as physical characteristics are concerned, SiC is considered as being an ideal material which is capable of solving the problems that SiN inherently has.

However, even though the relative dielectric constant of SiC is relatively low, it is still higher than that of low dielectric constant insulating materials (porous materials) whose relative dielectric constant is within the range of 2.2 to 2.8. Therefore, it is required, when a multi-layer wiring is to be actually formed, to eliminate as much as possible any superfluous portion of SiC which is no longer required to be left as an adhesion layer or as a barrier layer.

However, no one has yet succeeded to find a suitable polishing method which makes it possible to easily remove SiC. Therefore, it is strongly desired, particularly in the formation of a multi-layer wiring, to find a method which makes it possible to easily remove a superfluous portion of SiC.

BRIEF SUMMARY OF THE INVENTION

According to one aspect of the present invention, there is provided a polishing slurry for chemical mechanical polishing (CMP) of an SiC series compound film, which comprises colloidal silica having a primary particle diameter ranging from 5 nm to 30 nm; and at least one acid selected from the group consisting of amino acid having a benzene ring and an organic acid having a heterocycle, wherein the colloidal silica is incorporated in the polishing slurry at a concentration ranging from 0.5 to 10% by weight, and the acid is incorporated in the polishing slurry at a concentration ranging from 0.1 to 3% by weight.

According to another aspect of the present invention, there is also provided a chemical-mechanical polishing method, which comprises polishing an SiC series compound film by making use of a polishing slurry for CMP, wherein the polishing slurry comprises colloidal silica having a primary particle diameter ranging from 5 nm to 30 nm, and at least one acid selected from the group consisting of an amino acid having a benzene ring and an organic acid having a heterocycle.

According to a further aspect of the present invention, there is also provided a method of manufacturing a semiconductor device, the method comprising:

forming a groove and/or a hole in an insulating film formed above a substrate and having an SiC series compound layer on the top surface thereof;

depositing a conductive film containing a metal as a main component a surface of the insulating film to thereby bury the groove and/or the hole with the conductive film;

removing a portion of the conductive film which is deposited outside of the groove and/or the hole; and polishing at least a portion of the SiC series compound layer by making use of a polishing slurry for CMP comprising colloidal silica having a primary particle diameter ranging from 5 nm to 30 nm, and at least one acid selected from the group consisting of amino acid having a benzene ring and an organic acid having a heterocycle to thereby remove the at least a portion of the SiC series compound layer.

According to a still further aspect of the present invention, there is also provided a method of manufacturing a semiconductor device, the method comprising:

filling a groove and/or a hole formed in an insulating film deposited above a substrate with a conductive film containing a metal as a main component;

forming a recessed portion by removing an upper surface portion of the conductive film;

depositing an SiC series compound film on the insulating film to thereby fill the recessed portion with the SiC series compound film; and polishing the SiC series compound film deposited on the insulating film by making use of a polishing slurry for CMP comprising colloidal silica having a primary particle diameter ranging from 5 nm to 30 nm, and at least one acid selected from the group consisting of an amino acid having a benzene ring and an organic acid having a heterocycle to thereby partially remove the SiC series compound film and to selectively leave the SiC series compound film on the conductive film.

BRIEF DESCRIPTION OF THE SEVERAL VIEWS OF THE DRAWING

FIG. 3 is a graph illustrating a distribution of particle diameter of silica particles; and FIG. 4 is a graph illustrating the pH dependency of the polishing speed of SiC.

DETAILED DESCRIPTION OF THE INVENTION

Figure 1A:
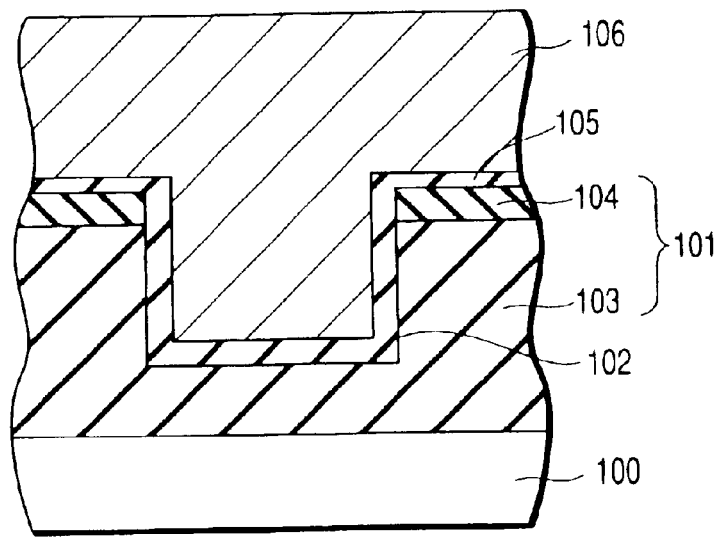
FIGS. 1A to 1C are cross-sectional views each illustrating, stepwise, the process for forming a Cu damascene wiring according to one example of the present invention.

Next, the embodiments of the present invention will be explained in detail.

The body to be polished (hereinafter referred to as polishing body), to which the polishing slurry according to one embodiment of the present invention is applied is an SiC series compound film, wherein at least one element selected from the group consisting of O, H and N may be included in the SiC series compound.

The polishing particle to be included in the polishing slurry according to this embodiment is colloidal silica having a primary particle diameter ranging from 5 nm to 30 nm, more preferably from 8 nm to 20 nm. For example, fumed alumina (primary particle diameter: 20 nm) and fumed silica (primary particle diameter: 7 nm and 20 nm), both of which are generally employed as a polishing particle, are substantially incapable of polishing an SiC film.

Further, if the primary particle diameter of colloidal silica is less than 5 nm, problems would be raised in terms of the dispersibility of particles and of the stability of slurry, thus making it not preferable from a practical viewpoint. On the other hand, if the primary particle diameter of colloidal silica exceeds 30 nm, it may become difficult to polish SiC.

In the following, the polishing speed (rate) of SiC film relative to various magnitude of the primary particle diameter of colloidal silica is illustrated. Incidentally, the polishing slurry employed herein contained 5% by weight of colloidal silica, and 1.5% by weight of quinolinic acid, and the pH thereof was set to 2.

| Primary particle diameter | SiC polishing rate |
| --- | --- |
| 7 nm | 38 nm/min. |
| 15 nm | 42 nm/min. |
| 20 nm | 40 nm/min. |
| 30 nm | 35 nm/min. |
| 40 nm | 3 nm/min. |

It will be recognized from the above table that when the primary particle diameter of colloidal silica is 40 nm, thus exceeding 30 nm, the polishing rate of SiC would deteriorate sharply.

In this case, the particle diameter is an average particle diameter. More specifically, the diameters of 100 pieces or more of particle are determined from a TEM photograph and lognormally plotted to determine the particle diameter at a point where the cumulative frequency is 50%. Incidentally, when particles having a particle size distribution which exceeds 30 nm in average particle diameter is mixed in a slurry for the purpose of using it other than the polishing of SiC, two kinds of particle size distribution, i.e. a particle size distribution where the average particle diameter falls within the range of 5 nm to 30 nm, and another particle size distribution where the average particle diameter exceeds 30 nm, may be observed in the aforementioned plot. Even if a slurry is formulated by such two kinds of particle size distribution, the slurry should be considered to fall within the scope of the present invention. Namely, even if a plurality of particle size distributions are observed in a slurry, as long as the slurry includes a particle size distribution where the average particle diameter falls within the range of 5 nm to 30 nm, the slurry should be considered to fall within the scope of the present invention.

For example, even if colloidal silica is constituted by a particle size distribution "A" where the average particle diameter is 15 nm, and a particle size distribution "B" where the average particle diameter is 40.6 nm, and the colloidal silica is further mixed with fumed silica having a particle size distribution "C" where the average particle diameter is 58.4 nm as shown in FIG. 3, the polishing particle constituted by such colloidal silica and fumed silica is useful in this embodiment because of inclusion of the particle size distribution "A" where the average particle diameter is 15 nm.

The concentration of colloidal silica in the polishing slurry of this embodiment should preferably be confined within the range of 0.5 to 10% by weight, more preferably within the range of 0.5 to 5% by weight. If the concentration of colloidal silica is less than 0.5% by weight, the polishing rate may become unstable. On the other hand, if the concentration of colloidal silica exceeds 10% by weight, the dispersed state of colloidal silica in the polishing slurry may become unstable, i.e. undesirable.

The organic acid that can be included in the polishing slurry of this embodiment together with the aforementioned colloidal silica may be constituted by amino acid having a benzene ring or an organic acid having a heterocycle. Further, this organic acid may be constituted by both of amino acid having a benzene ring and an organic acid having a heterocycle.

As for the amino acid having a benzene ring, it is possible to employ phenylalanine and tyrosine. As for the organic acid having a heterocycle, it is possible to employ quinolinic acid, quinaldinic acid, nicotinic acid, picolinic acid, cinchomeronic acid and tryptophan. Among them, quinolinic acid is preferable for use.

The present inventors have conducted an experiment to assess the polishing rate where SiC was polished by making use of slurries containing various kinds of organic acids each exhibiting a low solubility to Cu. Namely, polishing slurries each constituted by an aqueous dispersion containing 3% by weight of colloidal silica (particle diameter: 20 nm) and 1% by weight of an organic acid were employed to polish SiC, thus measuring the polishing speed of each slurry.
The following are the results obtained.

Citric acid (trivalent chain organic acid having carboxyl group): 8 nm/min.

Malonic acid (bivalent chain organic acid having carboxyl group): 7 nm/min.

Maleic acid (bivalent chain organic acid having carboxyl group): 10 nm/min.

Quinolinic acid (bivalent organic acid having heterocycle): 32 nm/min.

Quinaldinic acid (monovalent organic acid having heterocycle): 26 nm/min.

Nicotinic acid (monovalent organic acid having heterocycle): 27 nm/min.

Phenylalanine (monovalent amino acid having benzene ring): 22 nm/min.

It will be recognized from these results that a cyclic organic acid having a heterocycle or benzene ring is faster in polishing speed than a chain organic acid. The reasons for this may be conceivably attributed to the fact that since heterocycle and benzene ring are relatively strong in hydrophobicity, so that due to interaction between the hydrophobicity of the heterocycle and benzene ring and the hydrophobicity of SiC, the polishing frictional force is cause to increase. Incidentally, even with the organic acid having a heterocycle or benzene ring, if a long linear chain like that of a surfactant is once introduced into the organic acid, the hydrophobicity of the resultant organic acid would become much stronger to permit the organic acid to adsorb onto an SiC series compound film, thus resulting in the hydrophilization of the SiC series compound film, i.e. an undesirable state.

The hydrophilic group has preferably a structure exhibiting both acidicity and basicity. Since an amino acid is provided with a carboxyl group and amino group, the amino acid having a benzene ring has both acidicity and basicity. On the other hand, if the organic acid having a heterocycle contains an element exhibiting basicity such as N in the heterocycle, the organic acid would exhibit both acidicity and basicity, rendering it preferable. In the employment of the organic acid having such a heterocycle, the organic acid useful in the present invention is not limited to the organic acid having a carboxyl group, but an organic acid having, for example, a sulfo group is also useful.

The concentration of the organic acid in the polishing slurry of this embodiment may preferably be confined within the range of 0.1 to 3% by weight. If the concentration of the organic acid is less than 0.1% by weight, the polishing rate may become unstable. On the other hand, if the concentration of the organic acid exceeds 3% by weight, the dispersed state of colloidal silica in the polishing slurry may tend to become unstable due to the salting-out effect of the organic acid.

Since there is a tendency that the polishing slurry according to this embodiment may become incapable of effectively polishing SiC when the polishing slurry is employed with the pH thereof falling within the neutral region, the polishing slurry may preferably be employed in an acidic (pH=1–5) or alkaline (pH=8–11) state thereof. Namely, it is conceivable that when this polishing slurry is employed in an acidic state thereof, the colloidal silica (+) is allowed to ionically bond to the organic acid (−) to generate an aggregate, and when this polishing slurry is employed in an alkaline state thereof, the polishing slurry is enabled to form a suitable aggregate, thereby improving the polishing rate in either case.

FIG. 4 shows a relationship between the pH of the polishing slurry and the polishing rate of SiC. It will be recognized from FIG. 4 that the polishing rate of SiC by the polishing slurry can be enhanced in the acidic and alkaline regions, in particular, in the alkaline region.

Next, various examples of the present invention will be explained in detail.

EXAMPLE 1

Figure 1B:
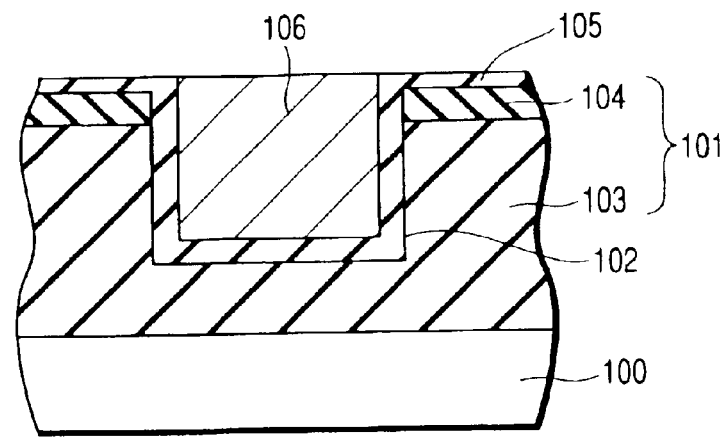

One example where the present invention was applied to the formation of a Cu damascene wiring will be explained with reference to FIGS. 1A to 1C.

First of all, an insulating film 101 was formed on a silicon wafer 100 and etched to form a pattern of groove 102 having a depth of 300 nm. This insulating film 101 was constituted by a 2-ply structure comprising a low dielectric constant insulating film (LKD27 (tradename): JSR Co., Ltd.) 103 having a thickness of 600 nm, and an SiCO film 104 having a thickness of 50 nm. Then, a TaN liner 105 having a thickness of 10 nm was deposited on the insulating film 101 provided with the groove 102. Thereafter, a Cu film 106 having a thickness of 600 nm was deposited on the surface of TaN liner 105 to thereby fill the groove 102 with the Cu film (FIG. 1A). Incidentally, the Cu film 106 was formed in such a manner that a seed layer was formed at first by means of sputtering method, and then, the Cu film 106 was formed on this seed layer by means of a plating method.

Then, the surface of the Cu film 106 was subjected to a CMP treatment to remove a portion of the Cu film 106 which was deposited on the TaN liner 105 existing outside the groove 102. The polishing was performed according to the following conditions.

Polishing slurry: CMS7301 (tradename: JSR Co., Ltd.);

Flow rate of slurry: 200 cc/min;

Polishing pad: IC1000 (tradename; RODEL Co., Ltd.);

Load: 300 gf/cm$^2$.

Rotational speed of carrier and turntable: 100 rpm.

The polishing was performed for two minutes under the conditions described above to obtain a structure as shown in FIG. 1B.

Then, the SiC 104 and a portion of the TaN liner 105 which was located outside the groove 102 were polished and removed. The conditions for this polishing were as follows.

Polishing slurry: An aqueous dispersion comprising hydrogen peroxide (oxidizing agent) 0.2% by weight, quinolinic acid 1% by weight, and colloidal silica (average particle diameter: 20 nm) 3% by weight, the pH of the dispersion being controlled to 10 by making use of KOH;

Flow rate of slurry: 200 cc/min;

Polishing pad: IC1000 (tradename; RODEL Co., Ltd.);

Load: 300 gf/cm$^2$.

Rotational speed of carrier and turntable: 100 rpm.

When the polishing was performed for two minutes under the conditions described above, it was possible to easily remove the SiCO film 104. As a result, it was possible to obtain a structure wherein a Cu damascene wiring was buried in the low dielectric constant insulating film 103 as shown in FIG. 1C.

EXAMPLE 2

Figure 2A:
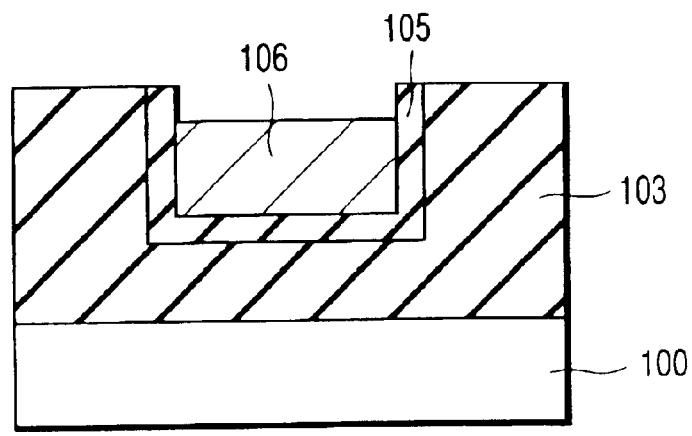
FIGS. 2A to 2C are cross-sectional views each illustrating, in stepwise, the process for forming a Cu damascene wiring according to another example of the present invention.

One example where the present invention was applied to the formation of a Cu damascene wiring having a diffusion/oxidation preventive film constituted by SiC as an upper layer will be explained with reference to FIGS. 2A to 2C.

Figure 1C:
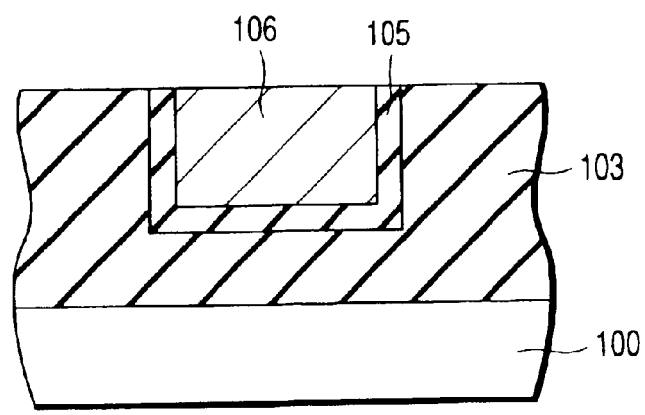

First of all, the procedures of Example 1 were repeated to obtain a Cu damascene wiring as shown in FIG. 1C. Then, by making use of a mixed solution constituted by hydrogen peroxide and hydrochloric acid, the upper surface of the Cu damascene wiring 106 was etched away to a depth of about 50 nm (FIG. 2A).

Figure 2B:
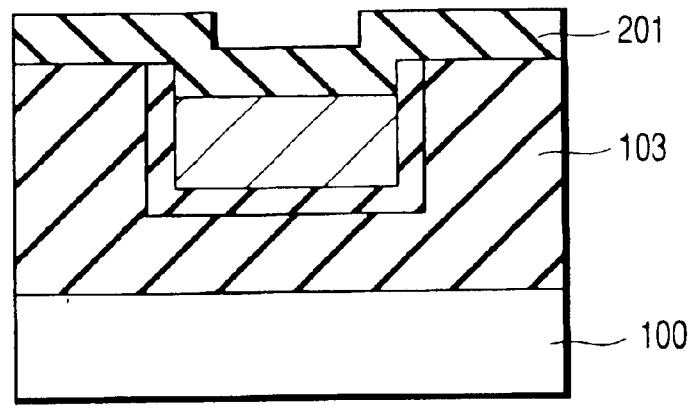

Then, an SiCN film 201 having a thickness of 80 nm was deposited all over the surface (FIG. 2B). Thereafter, a portion of the SiCN film 201 which was located over the surface other than the surface of the Cu damascene wiring 106 was polished and removed. The conditions for this polishing were as follows.

Polishing slurry: An aqueous dispersion (pH=2) comprising picolinic acid 1.5% by weight, and colloidal silica (average particle diameter: 15 nm) 5% by weight;

Flow rate of slurry: 200 cc/min;

Polishing pad: IC1000 (tradename; RODEL Co., Ltd.);

Load: 300 gf/cm$^2$.

Rotational speed of carrier and turntable: 100 rpm.

Figure 2C:
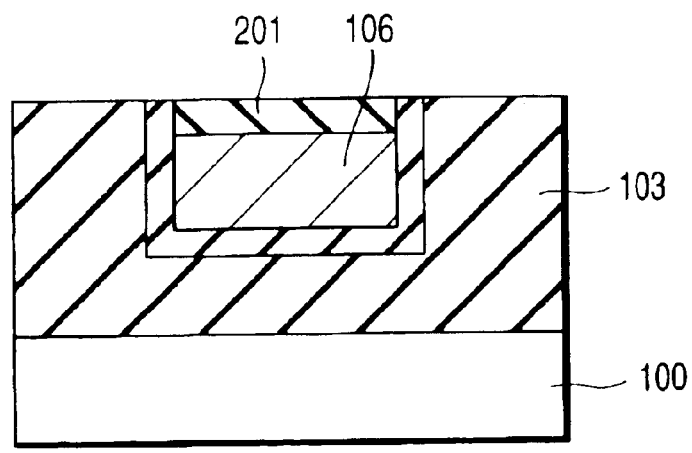

The polishing was performed for two minutes under the conditions described above to obtain a structure wherein a Cu damascene wiring was provided with a diffusion/oxidation preventive film 201 constituted by SiCN as an upper layer as shown in FIG. 2C.

The interlayer capacity of the Cu damascene wiring thus obtained was found to indicate an improvement of 5% as compared with the structure where the SiCN film was deposited all over the surface.

As explained above, according to the embodiments of the present invention, it is now possible to easily perform the removal by means of chemical mechanical polishing of an SiC series compound film which has been conventionally considered as difficult to remove. Further, it is now possible, through the employment of the polishing slurry and the polishing method of the embodiments according to the present invention, to manufacture a semiconductor device provided with a high-performance damascene wiring where the RC delay can be alleviated.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A chemical mechanical-polishing method, which comprises polishing an SiC series compound film by making use of a polishing slurry for CMP, wherein the polishing slurry comprises colloidal silica having a primary particle diameter ranging from 5 nm to 30 nm, and at least one acid selected from the group consisting of an amino acid having a benzene ring and an organic acid having a heterocycle.

2. The method according to claim 1, wherein the SiC series compound is SiC containing at least one element selected from the group consisting of O, H and N.

3. The method according to claim 1, wherein the colloidal silica is incorporated in the polishing slurry at a concentration ranging from 0.5 to 10% by weight, and the acid is incorporated in the polishing slurry at a concentration ranging from 0.1 to 3% by weight.

4. The method according to claim 1, wherein the amino acid having a benzene ring is at least one acid selected from the group consisting of phenylalanine and tyrosine.

5. The method according to claim 1, wherein the organic acid having a heterocycle is at least one acid selected from the group consisting of quinolinic acid, quinaldinic acid, nicotinic acid, picolinic acid, cinchomeronic acid and tryptophan.

6. A method of manufacturing a semiconductor device, the method comprising:
   forming a groove and/or a hole in an insulating film formed above a substrate and having an SiC series compound layer on a top surface thereof;
   depositing a conductive film containing a metal as a main component on a surface of the insulating film to thereby bury said groove and/or said hole with said conductive film;
   removing a portion of the conductive film which is deposited outside of the groove and/or the hole; and
   polishing at least a portion of the SiC series compound layer by making use of a polishing slurry for CMP comprising colloidal silica having a primary particle diameter ranging from 5 nm to 30 nm, and at least one acid selected from the group consisting of amino acid having a benzene ring and an organic acid having a heterocycle to thereby remove said at least a portion of the SiC series compound layer.

7. The method according to claim 6, wherein the conductive film comprises copper.

8. The method according to claim 6, wherein the SiC series compound is SiC containing at least one element selected from the group consisting of O, H and N.

9. The method according to claim 6, wherein the colloidal silica is incorporated in the polishing slurry at a concentration ranging from 0.5 to 10% by weight, and the acid is incorporated in the polishing slurry at a concentration ranging from 0.1 to 3% by weight.

10. The method according to claim 6, wherein the amino acid having a benzene ring is at least one acid selected from the group consisting of phenylalanine and tyrosine.

11. The method according to claim 6, wherein the organic acid having a heterocycle is at least one acid selected from the group consisting of quinolinic acid, quinaldinic acid, nicotinic acid, picolinic acid, cinchomeronic acid and tryptophan.

12. A method of manufacturing a semiconductor device, the method comprising:
   filling a groove and/or a hole formed in an insulating film deposited above a substrate with a conductive film containing a metal as a main component;
   forming a recessed portion by removing an upper surface portion of the conductive film;
   depositing an SiC series compound film on the insulating film to thereby fill the recessed portion with the SiC series compound film; and
   polishing the SiC series compound film deposited on the insulating film by making use of a polishing slurry for CMP comprising colloidal silica having a primary particle diameter ranging from 5 nm to 30 nm, and at least one acid selected from the group consisting of an amino acid having a benzene ring and an organic acid having a heterocycle to thereby partially remove the SiC series compound film and to selectively leave the SiC series compound film on the conductive film.

13. The method according to claim 12, wherein the conductive film comprises copper.

14. The method according to claim 12, wherein the SiC series compound is SiC containing at least one element selected from the group consisting of O, H and N.

15. The method according to claim 12, wherein the colloidal silica is incorporated in the polishing slurry at a concentration ranging from 0.5 to 10% by weight, and the acid is incorporated in the polishing slurry at a concentration ranging from 0.1 to 3% by weight.

16. The method according to claim 12, wherein the amino acid having a benzene ring is at least one acid selected from the group consisting of phenylalanine and tyrosine.

17. The method according to claim 12, wherein the organic acid having a heterocycle is at least one acid selected from the group consisting of quinolinic acid, quinaldinic acid, nicotinic acid, picolinic acid, cinchomeronic acid and tryptophan.

* * * * *